United States Patent
Lee et al.

(10) Patent No.: US 7,403,362 B2
(45) Date of Patent: Jul. 22, 2008

(54) LATCH-UP RESTISTANT ESD PROTECTION CIRCUIT AND METHOD THEREOF

(75) Inventors: Chao-Cheng Lee, Hsin-Chu (TW); Yung-Ming Chiu, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/675,083

(22) Filed: Feb. 15, 2007

(65) Prior Publication Data
US 2007/0188953 A1   Aug. 16, 2007

(30) Foreign Application Priority Data
Feb. 15, 2006   (TW) ............... 95105075 A

(51) Int. Cl.
*H02H 9/00* (2006.01)
*H02H 3/20* (2006.01)
*H02H 9/04* (2006.01)
*H02H 3/22* (2006.01)
*H02H 1/00* (2006.01)
*H02H 1/04* (2006.01)
*H01C 7/12* (2006.01)

(52) U.S. Cl. .................. 361/56; 361/91.1; 361/111; 361/118

(58) Field of Classification Search ............ 361/56, 361/91.1, 111, 118
See application file for complete search history.

(56) References Cited

U.S. PATENT DOCUMENTS

| | | | | |
|---|---|---|---|---|
| 5,910,873 A | * | 6/1999 | Boluna et al. | 361/56 |
| 5,946,177 A | * | 8/1999 | Miller et al. | 361/56 |
| 6,665,160 B2 | * | 12/2003 | Lin et al. | 361/56 |
| 6,849,902 B1 | | 2/2005 | Lin | |
| 7,050,282 B2 | | 5/2006 | Chuang et al. | |
| 2003/0026054 A1 | | 2/2003 | Hulfachor et al. | |
| 2003/0223166 A1 | | 12/2003 | Chen et al. | |
| 2005/0002139 A1 | | 1/2005 | Yeh et al. | |
| 2007/0171587 A1 | * | 7/2007 | Lee et al. | 361/56 |

* cited by examiner

*Primary Examiner*—Michael J Sherry
*Assistant Examiner*—Dharti H Patel
(74) *Attorney, Agent, or Firm*—Winston Hsu

(57) ABSTRACT

The present invention is to provide a latch-up resistant electrostatic discharge (ESD) protection circuit and method thereof, which comprises a clamping circuit being able to discharge when activated, a sustaining unit for directing electrostatic charge via said sustaining unit to said clamping circuit when activated and a sensing unit for activating said clamping circuit and said sustaining unit. When an ESD event, a signal noise or a power bounce is detected, said clamping circuit and said sensing unit is activated, said sustaining unit is activated to increase discharging ability of said clamping circuit, and then said sensing unit self resets after a period of time to deactivate said sustaining unit, thereby said clamping circuit is deactivated and a latch-up is prevented.

16 Claims, 10 Drawing Sheets

LATCH-UP RESISTANT ESD PROTECTION CIRCUIT AND METHOD THEREOF

FIELD OF THE INVENTION

The present invention relates to a latch-up resistant electrostatic discharge (ESD) protection circuit and method thereof, more particularly relating to an electrostatic discharge (ESD) protection circuit having a sensing unit for self resetting that deactivates itself when an ESD discharge is completed to prevent a latch-up.

BACKGROUND OF THE INVENTION

During the mass-production of integrated circuits (IC), a supplementary electrostatic discharge (ESD) protection circuit is commonly placed between a power node (Vdd) and a ground node to prevent the core circuit from being attacked by an external electrostatic charge while not disrupting normal operation of the core circuit in regular working mode.

Refer to FIG. 1. FIG. 1 shows a conventional ESD protection circuit (also known as a clamping circuit). An ESD detecting unit 12, an ESD amplifying unit 14 and an ESD draining unit 16 are sitting between the power source and the ground.

When an ESD attacks (an ESD zap) said power node Vdd, the voltage level V1 between said ESD amplifying unit 14 and said detecting unit 12 instantly jumps to the same level as Vdd, causing said draining unit 16 to be activated and said power node Vdd to discharge through said draining unit 16. Said voltage level V1 gradually discharges through said detecting unit 12, ultimately changes the state of said ESD amplifying unit 14 and turns off said ESD draining unit 16.

Refer to FIG. 2. FIG. 2 shows another conventional ESD protection clamping circuit. For the purpose of the IC effectively discharging from Vdd when an ESD zap occurs without overly increasing the area of said detecting unit 12, a hysteresis unit (also known as a sustaining unit) 18 is implemented in said clamping circuit. Said sustaining unit 18 improves the discharging ability of said clamping circuit described below. When node V1 is attacked by an ESD zap and its voltage level is increased to the same as the power source Vdd, the voltage at the internal node V2 of said amplifying unit 14 is pulled to ground level, activating said sustaining unit 18 to form a closed current path from the power source Vdd to V1. At this moment, the current driving ability of said sustaining unit 18 on said node V1 is stronger than the discharging ability of said ESD detecting unit 12 on V1. As a result, the voltage level at V1 is maintained at the same level as said power source Vdd. By means of this positive feedback, when the IC encounters an ESD attack, said ESD draining unit 16 could continuously drain the ESD current from Vdd and therefore increases the protection provided by the clamping circuit on the core circuit in said IC.

On the other hand, the addition of said sustaining unit 18 also increases the risk of having a latch-up on said draining unit 16. For example, a sudden power on or a power bounce during normal operation can activate said clamping circuit. Once said clamping circuit is activated, a latch-up in said clamping circuit may occur since said sustaining unit is continuously on and so is said draining unit 16, drawing a significant amount of current from said power source Vdd to said ground.

SUMMARY OF THE INVENTION

After considerable research and experimentation, an ESD protection circuit and method according to the present invention have been developed so as to overcome the drawbacks associated with said prior method.

It is an object of the present invention to provide an ESD protection circuit and method that deactivates itself when an ESD discharge is completed to prevent a latch-up.

It is another object of the present invention to provide an ESD protection circuit which comprises a clamping circuit being able to discharge when activated, a sustaining unit for directing electrostatic charge via said sustaining unit to said clamping circuit when activated and a sensing unit for activating said clamping circuit and said sustaining unit. When an ESD event, a signal noise or a power bounce is detected, said clamping circuit and said sensing unit is activated, and consequently said sustaining unit is activated to increase discharging ability of said clamping circuit. Said sensing unit self resets after a period of time to deactivate said sustaining unit, thereby said clamping circuit is deactivated and a latch-up is prevented.

It is still another object of the present invention to provide an ESD protection method which comprises the steps of activating a sensing unit, activating a sustaining unit for enabling continuous discharge by a clamping circuit; and resetting said sensing unit for deactivating said sustaining unit, thereby said clamping circuit is deactivated in response to the deactivation of said sustaining unit.

The above and other objects, features and advantages of the present invention will become apparent from the following detailed description taken with the accompanying drawings.

DETAILED DESCRIPTION OF THE PREFERRED EMBODIMENTS

Figure 1:
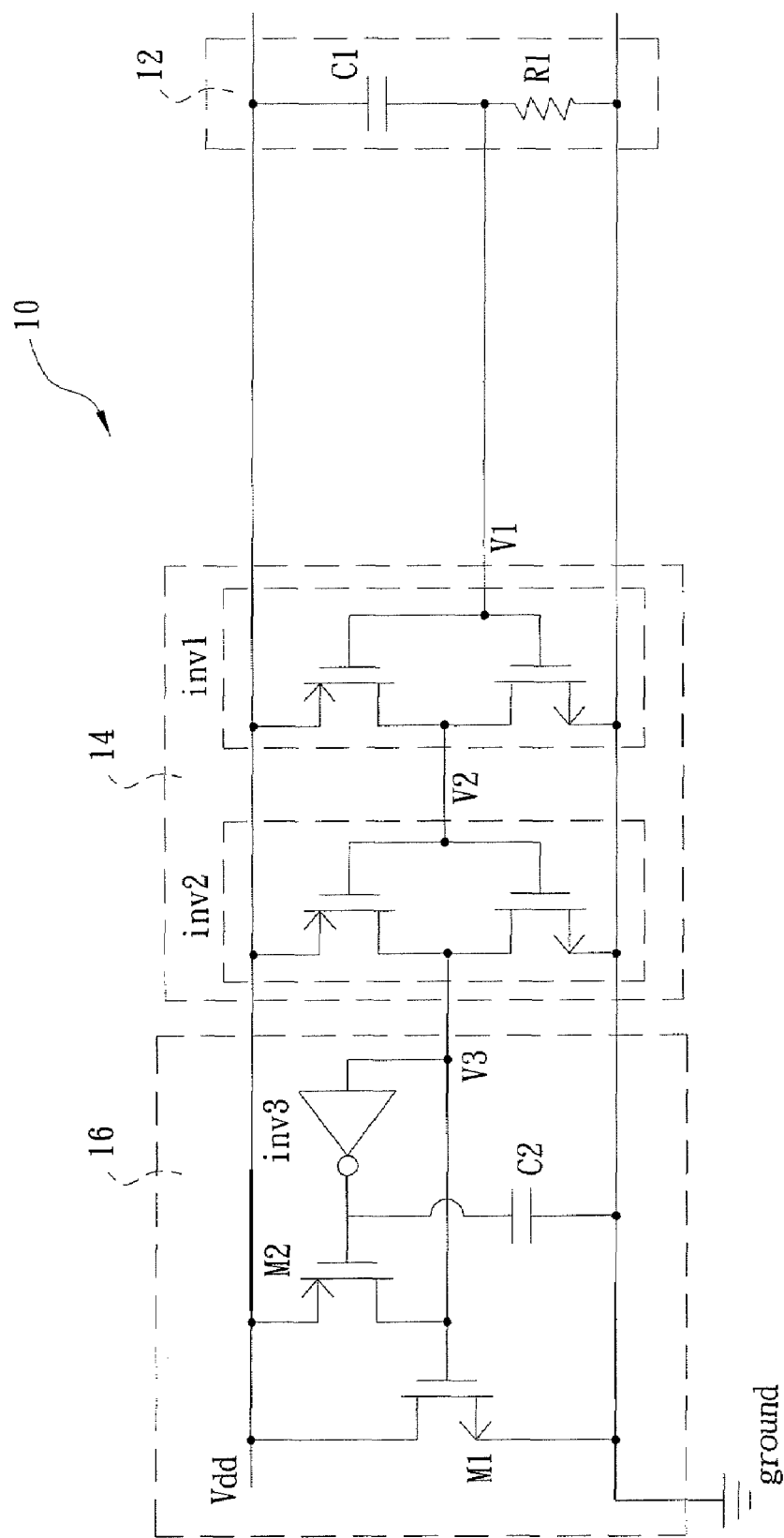
FIG. 1 shows a conventional ESD protection circuit.
Figure 2:
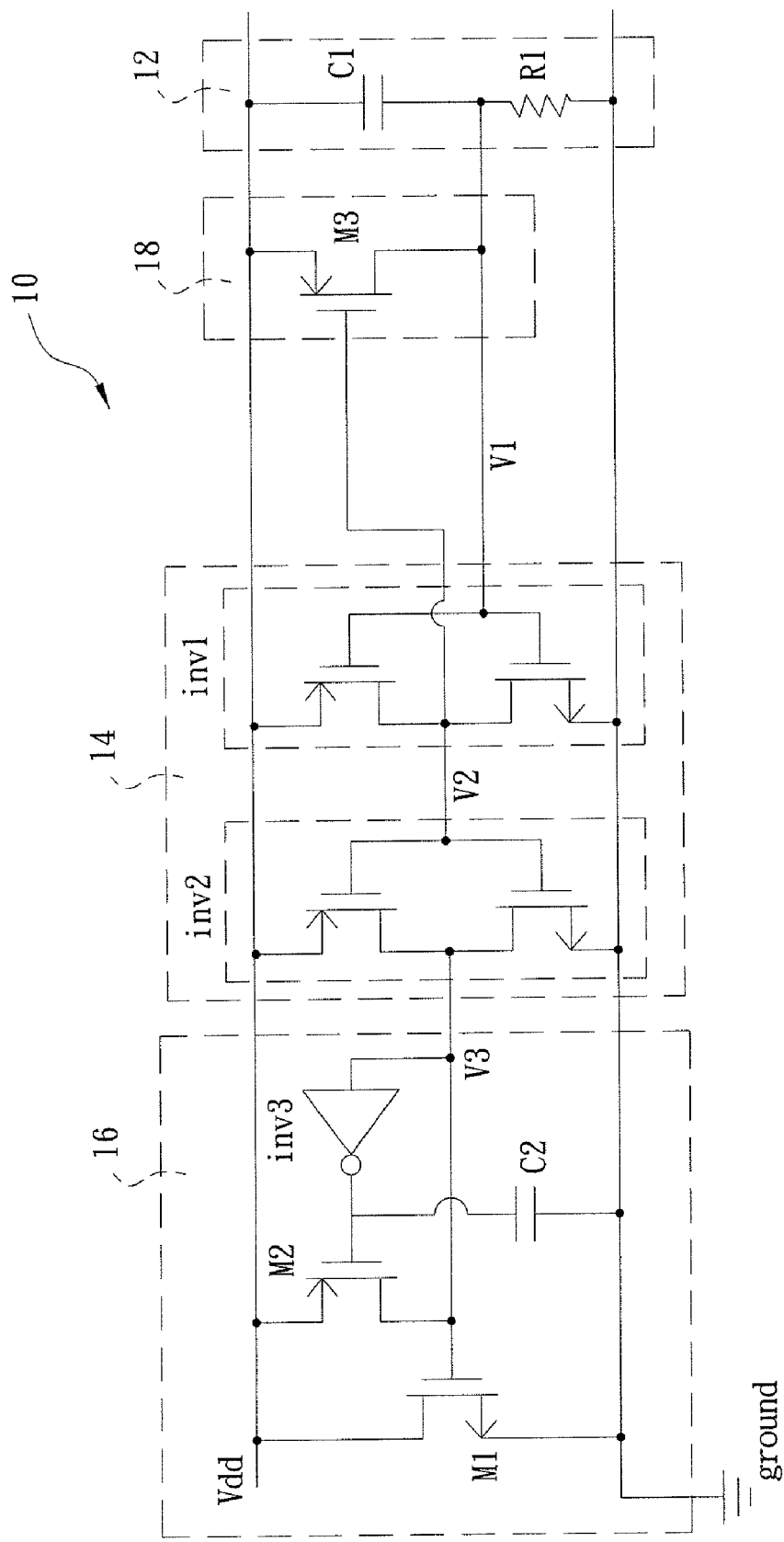
FIG. 2 shows another conventional ESD protection circuit.
Figure 3:
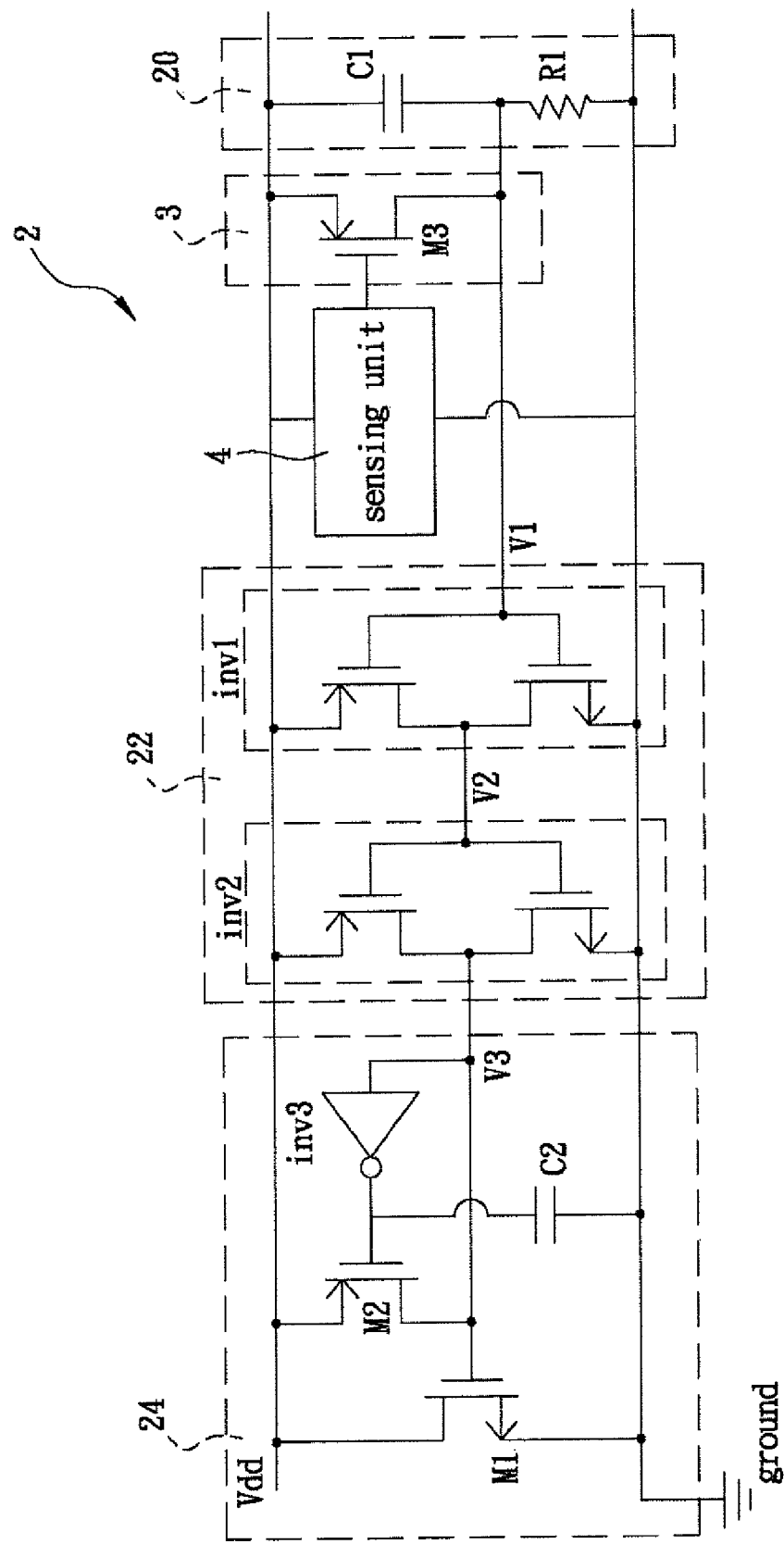
FIG. 3 shows a structural diagram of an embodiment of the ESD protection circuit according to the present invention.

Refer to FIG. 3, a structural diagram of a embodiment of the ESD protection circuit (also known as a clamping circuit) 2 according to the present invention. The clamping circuit 2 comprises an ESD detecting unit 20, an ESD amplifying unit 22, an ESD draining unit 24, a sustaining unit 3 and a sensing unit 4. Said sustaining unit 3 is coupled to an input terminal of said ESD amplifying unit 22, an output terminal of said sensing unit 4 and a power source Vdd. Said sensing unit 4 is coupled to said sustaining unit 3 and said amplifying unit 22.

Figure 4:
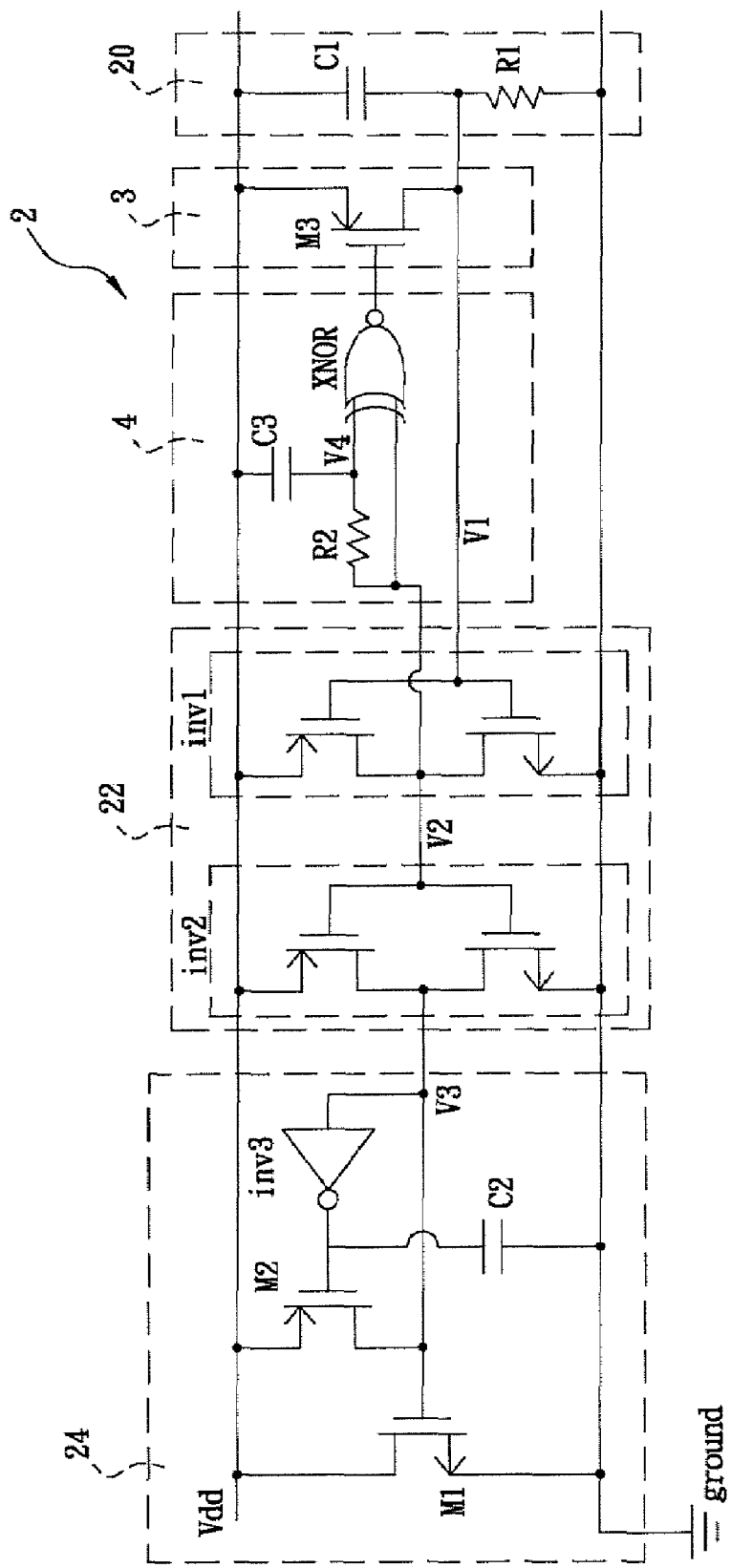
FIG. 4 shows a first embodiment of the ESD protection circuit according to the diagram in FIG. 3.

Refer to FIG. 4. FIG. 4 shows a first embodiment of the ESD protection circuit according to the diagram in FIG. 3. Said ESD detecting unit 20 has a first capacitor Cl and a first resistor R1 with said first capacitor C1 and said first resistor R1 being coupled in series. Said first capacitor is coupled to said power source Vdd while said first resistor is coupled to a ground node.

Said ESD amplifying unit 22 includes a first inverter INV1 and a second inverter INV2. Each of said inverters is composed of a PMOS transistor and an NMOS transistor with the source terminal of said PMOS transistors being coupled to said power source Vdd, and the source terminal of said NMOS transistors being coupled to said ground. The gate terminals of said PMOS transistor and said NMOS transistor of the same inverter are coupled together to form an input of said inverters INV1 and INV2. The drain terminals of said PMOS transistor and said NMOS transistor of the same inverter are coupled together to form an output of said inverters INV1 and INV2. Said output of said inverter INV1 is coupled to said input of said inverter INV2 and said input of said inverter INV1 is coupled to the junction of said first capacitor C1 and said first resistor R1.

Said sustaining unit 3 includes a third transistor M3 (a PMOS transistor). The source terminal of said third transistor M3 is coupled to said power source Vdd, the drain terminal is coupled to the junction of said first capacitor C1 and said first resistor R1 and the gate terminal is coupled to the output of said sensing unit 4.

Said sensing unit 4 includes an Exclusive NOR (XNOR) gate, a second resistor R2 and a third capacitor C3 wherein one end of said second resistor R2 and one end of said third capacitor C3 are coupled together and to a first input terminal of said XNOR gate. The other end of said second resistor R2 is coupled to a second input terminal of said XNOR gate and to an output terminal of the first inverter INV1. The other end of said third capacitor C3 is coupled to said power source Vdd.

Said ESD draining unit 24 comprises a third inverter INV3, a second capacitor C2, a second transistor M2 (PMOS), a first NMOS transistor M1 with the source terminal of M1 being coupled to said ground. An input terminal of said third inverter INV3 is coupled to said output terminal of said ESD amplifying unit 22, the gate terminal of said second transistor M2 is coupled to an output terminal of said third inverter INV3, the source terminal of said second transistor M2 is coupled to said power source Vdd and the drain terminal of said second transistor M2 is coupled to the gate of said first transistor M1. One end of said second capacitor C2 is coupled to the gate terminal of said second transistor M2 and the input terminal of said third inverter INV3, the other end of C2 is coupled to said ground. The drain terminal of said first transistor M1 is coupled to said power source Vdd and the gate terminal of M1 is coupled to an output terminal of said second inverter INV2.

When an IC incorporating said first embodiment is attacked by an ESD zap, the voltage level V4 at said first input of said XNOR gate instantaneously pulls up to the voltage level of Vdd, and the voltage level V2 at the junction of said inverters INV1 and INV2 drops to the level of said ground. The output of sensing unit 4 becomes a logic zero, which in turn activates said sustaining unit 3. The third transistor M3 is on, therefore the voltage level V1 at the input of said first inverter INV1 is maintained at Vdd. As the output voltage of said second inverter INV2 rises up, said second transistor M2 and said first transistor M1 are on for regulating the power via draining unit 24. As two inputs of said sensing unit 4 are coupled together, the voltage level V4 at the first input terminal of said XNOR and the voltage level V2 at the junction of said inverters INV1 and INV2 eventually become equal, thus the state at the output terminal of said sensing unit 4 is switched and said sustaining unit 3 is deactivated. Afterwards, the voltage level V1 at the input terminal of said ESD amplifying unit 22 continues being gradually discharged via said detecting unit 20. Ultimately V1 drops to the ground level, switches the state of the ESD amplifying unit 22. As the output terminal of said ESD amplifying unit 22 goes to logic zero, said third inverter INV3 and said second transistor M2, said ESD draining unit 24 continues to discharge for a period of time. After the expiration of said period of time, with said capacitor C2, said ESD draining unit 24 further discharges until the charge in said second capacitor C2 is completed drained. At which point said ESD draining unit 24 is deactivated.

please note that said sensing unit 4 in this particular embodiment consists of a second resistor R2, a third capacitor C3 and an XNOR gate. However, other circuits may achieve the same function without deviating from the scope of the present invention.

Figure 5:
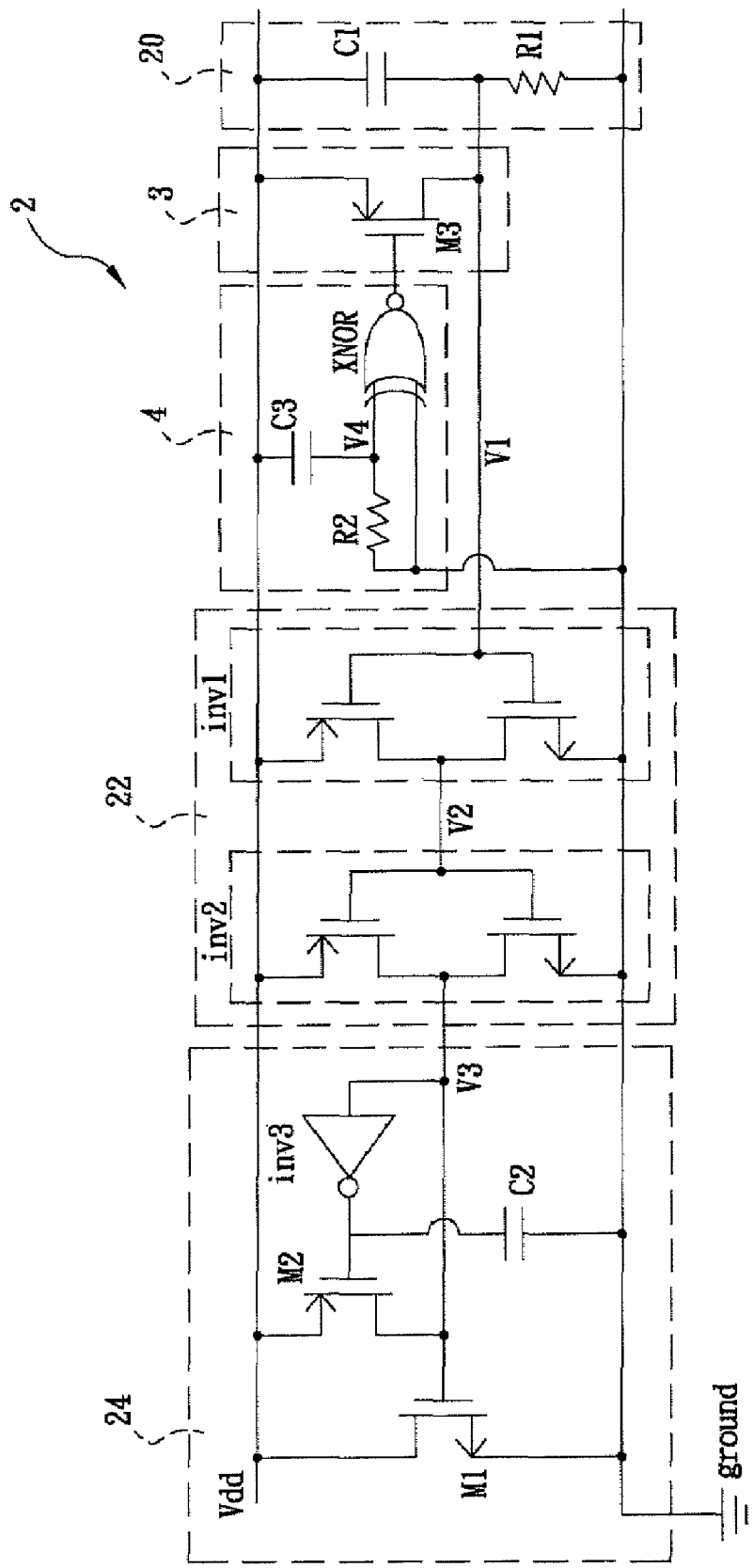
FIG. 5 shows a second embodiment of the ESD protection circuit according to the diagram in FIG. 3.

Refer to FIG. 5, a second embodiment of the ESD protection circuit according to the diagram in FIG. 3. The ESD detecting unit 20, ESD amplifying unit 22, ESD draining unit 24 and sustaining unit 3 and the structural connection of said second embodiment is the same as their corresponding counterparts in the first embodiment as depicted in FIG. 4. The components of the sensing unit 4 are same as in FIG. 4 as well. The difference occurs at the connection between the XNOR gate, the second resistor R2 and the third capacitor C3 where the other end of said second resistor R2 and the second input terminal of said XNOR gate are coupled to said ground.

When an IC incorporating said second embodiment is attacked by an ESD zap, the voltage level V1 at the input of said first invert INV1 and the voltage level V4 at said first input of said XNOR gate shoot up to the level of Vdd and the voltage level V2 at the junction of said inverters INV1 and INV2 drops to the level of said ground. The logic zero output of said sensing unit 4 activates said sustaining unit 3 to maintain the voltage level V1 at the input of said first invert INV1 at the same level as said power source Vdd. As two inputs of said sensing unit 4 are coupled together, the voltage level V4 at the first input terminal of said XNOR eventually drops to ground, thus switches the state at the output terminal of said sensing unit 4 and deactivates said sustaining unit 3. Afterwards, the voltage level V1 at the input terminal of said ESD amplifying unit 22 continues being gradually discharged via said detecting unit 20. Ultimately V1 drops to the ground level to switches states of the ESD amplifying unit 22 and deactivates said draining unit 24. Said sensing unit 4 in this particular embodiment consists of a second resistor R2, a third capacitor C3 and an XNOR gate. However, other circuits may achieve the same function without deviating from the scope of the current invention.

Figure 6:
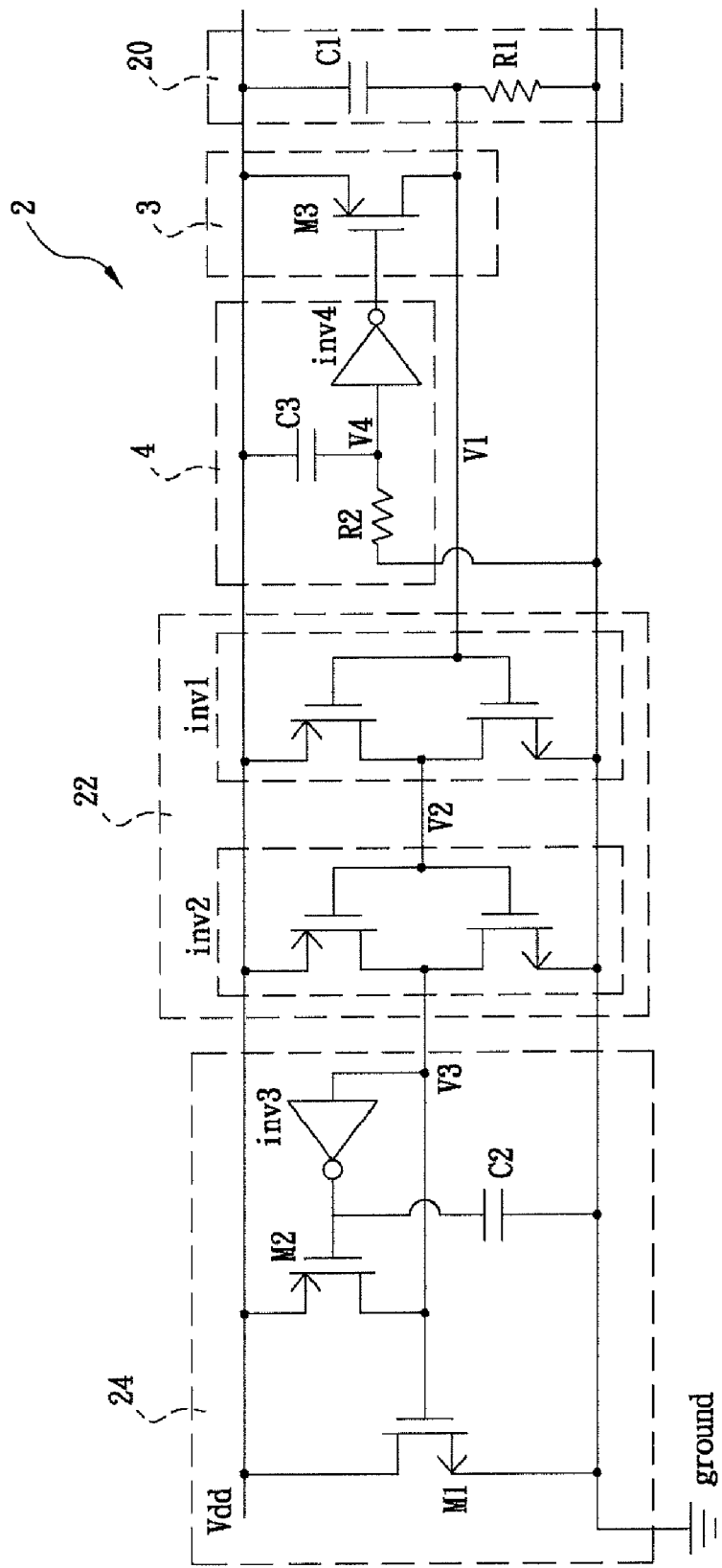
FIG. 6 shows a third embodiment of the ESD protection circuit according to the diagram in FIG. 3.

Refer to FIG. 6. FIG. 6 shows a third embodiment of the ESD protection circuit according to the diagram in FIG. 3. The ESD detecting unit 20, ESD amplifying unit 22, ESD draining unit 24 and sustaining unit 3 and the structural connection of said third embodiment is the same as their corresponding counterparts in the first embodiment as depicted in FIG. 4. However, said XNOR gate in said sensing unit 4 is now replaced by a fourth inverter INV4, said second resistor R2 and third capacitor C3 each has one end coupled to an input terminal of said fourth inverter INV4. The other end of said second resistor R2 is coupled to ground and the other end of said third capacitor C3 is coupled to said power source Vdd.

When an IC incorporating said third embodiment is attacked by an ESD zap, the voltage level V1 at the input of said first invert INV1 and the voltage level V4 at said input of said fourth inverter INV4 shoot up to the level of Vdd. The logic zero output of said sensing unit 4 activates said sustaining unit 3 to maintain the voltage level V1 at the input of said first invert INV1 at the same level as said power source Vdd. As the input of said sensing unit 4 is coupled to said ground through said second resistor R2, with an adequately selected resistance, the voltage level V4 at the input terminal of said fourth inverter INV4 eventually drops to ground, thus switches the state at the output terminal of said sensing unit 4 and deactivates said sustaining unit 3. Afterwards, the voltage level V1 at the input terminal of said ESD amplifying unit 22 continues being gradually discharged via said detecting unit 20. Ultimately V1 drops to the ground level to switches states of the ESD amplifying unit 22 and deactivates said draining unit 24. Said sensing unit 4 in this particular embodiment consists of a second resistor R2, a third capacitor C3 and a fourth inverter INV4. However, other circuits may achieve the same function without deviating from the scope of the current invention.

Figure 7:
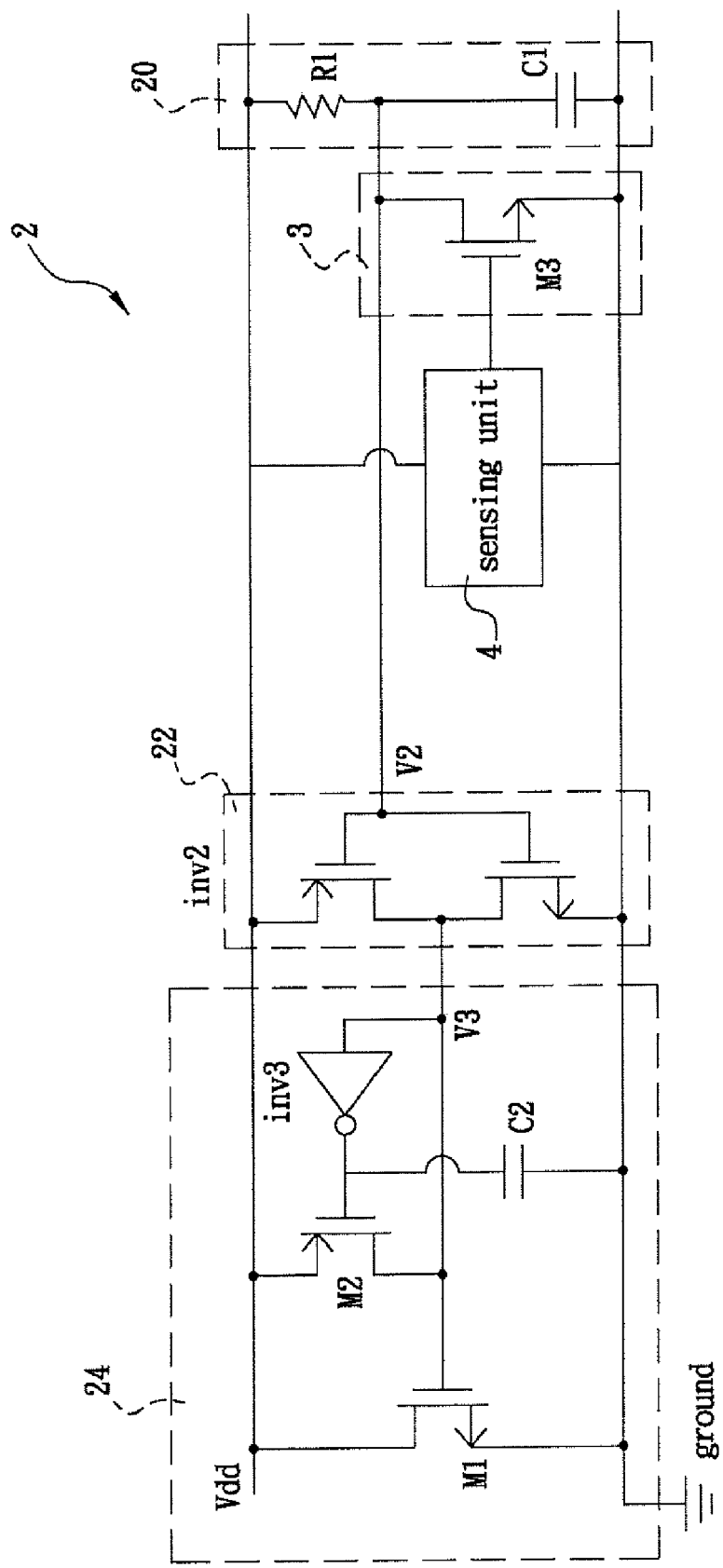
FIG. 7 shows a structural diagram of another embodiment of the ESD protection circuit according to the present invention.

Refer to FIG. 7, a structural diagram of another embodiment of the ESD protection circuit 2 according to the present invention. A clamping circuit 2 comprises an ESD detecting unit 20, an ESD amplifying unit 22, an ESD draining unit 24, a sustaining unit 3 and a sensing unit 4. Said sustaining unit 3 is coupled to an input terminal of said ESD amplifying unit 22, an output terminal of said sensing unit 4 and a ground node. Said sensing unit 4 is coupled to said sustaining unit 3 and said amplifying unit 22.

Figure 8:
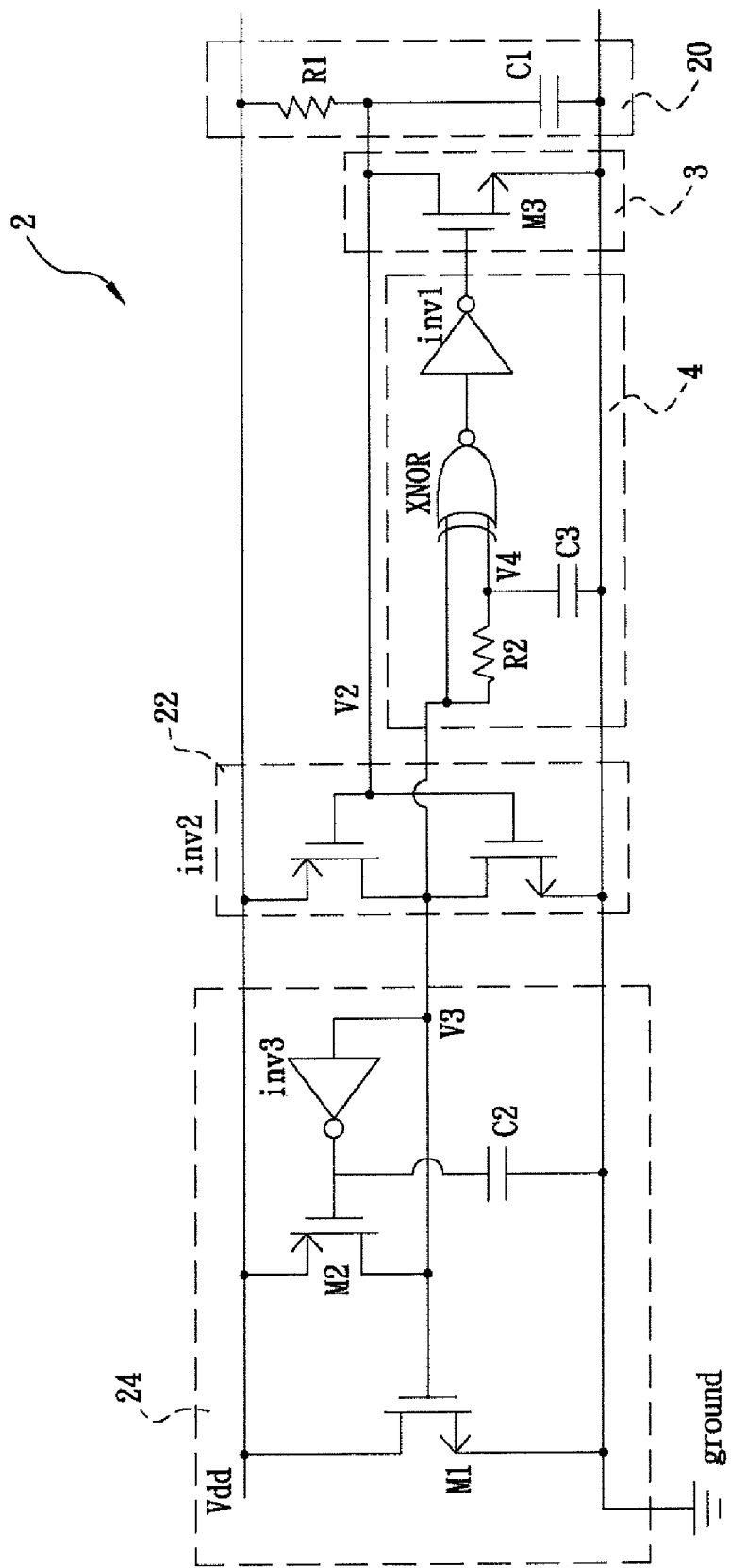
FIG. 8 shows a fourth embodiment of the ESD protection circuit according to the diagram in FIG. 7.

Refer to FIG. 8. FIG. 8 shows a fourth embodiment of the ESD protection circuit according to the diagram in FIG. 7. Said ESD detecting unit 20 has a first capacitor C1 and a first resistor R1 with said first capacitor C1 and said first resistor R1 being coupled in series. Said first capacitor is coupled to said power source Vdd while said first resistor is coupled to said ground node.

Said ESD amplifying unit 22 comprises a second inverter INV2. Said second inverters INV2 is composed of a PMOS transistor and an NMOS transistor with the source terminal of said PMOS transistors being coupled to said power source Vdd, and the source terminal of said NMOS transistors being coupled to said ground. The gate terminals of said PMOS transistor and said NMOS transistor are coupled together to form an input of said second inverters INV2 and said input is further coupled to the junction of said first capacitor C1 and said first resistor R1. The drain terminals of said PMOS transistor and said NMOS transistor of the same inverter are coupled together to form an output of said inverter INV2.

Said sustaining unit 3 comprises a third transistor M3 (an NMOS transistor). The source terminal of said third transistor M3 is coupled to said ground, the drain terminal is coupled to the junction of said first capacitor C1 and said first resistor R1 and the gate terminal is coupled to the output of said sensing unit 4.

Said sensing unit 4 comprises an XNOR gate, a first inverter INV1, a second resistor R2 and a third capacitor C3 wherein one end of said second resistor R2 and one end of said third capacitor C3 are coupled together and to a first input terminal of said XNOR gate. The other end of said second resistor R2 is coupled to a second input terminal of said XNOR gate and to an output terminal of said second inverter INV2 while the other end of said third capacitor C3 is coupled to said ground. Furthermore, an input terminal of said first inverter INV1 is coupled to an output terminal of said XNOR gate and an output terminal of said first inverter INV1 is coupled to the gate terminal of said third transistor M3.

Said ESD draining unit 24 comprises a first NMOS transistor M1 with the source terminal of M1 being coupled to said ground. The drain terminal of said first transistor M1 is coupled to said power source Vdd and the gate terminal of M1 is coupled to an output terminal of said second inverter INV2.

When an IC incorporating said fourth embodiment is attacked by an ESD zap, the voltage level V2 at the input terminal of said ESD amplifying unit 22 instantaneously drops to the level of said ground and the voltage level V3 at the output terminal of said ESD amplifying unit 22 raises to the level of said power source Vdd. At this moment, the voltage level V4 at said second input terminal of said XNOR gate goes to ground and the output of sensing unit 4 becomes a logic one, which in turn activates said sustaining unit 3. The third transistor M3 is on, therefore the voltage level V2 at the input of said second inverter INV2 is maintained at said ground level. As two inputs of said sensing unit 4 are coupled together, the voltage level V3 at the first input terminal of said XNOR and the voltage level V4 at the second input terminal of said XNOR eventually become equal, thus switches the state at the output terminal of said sensing unit 4 and deactivates said sustaining unit 3. Afterwards, the voltage level V2 at the input terminal of said ESD amplifying unit 22 continues being gradually charged via said detecting unit 20. Ultimately V2 rises up to said power source Vdd level, switches the state of the ESD amplifying unit 22 and deactivates said draining unit 24. Said sensing unit 4 in this particular embodiment consists of a second resistor R2, a third capacitor C3, a first inverter INV1 and an XNOR gate. However, other circuits may achieve the same function without deviating from the scope of the current invention.

Figure 9:
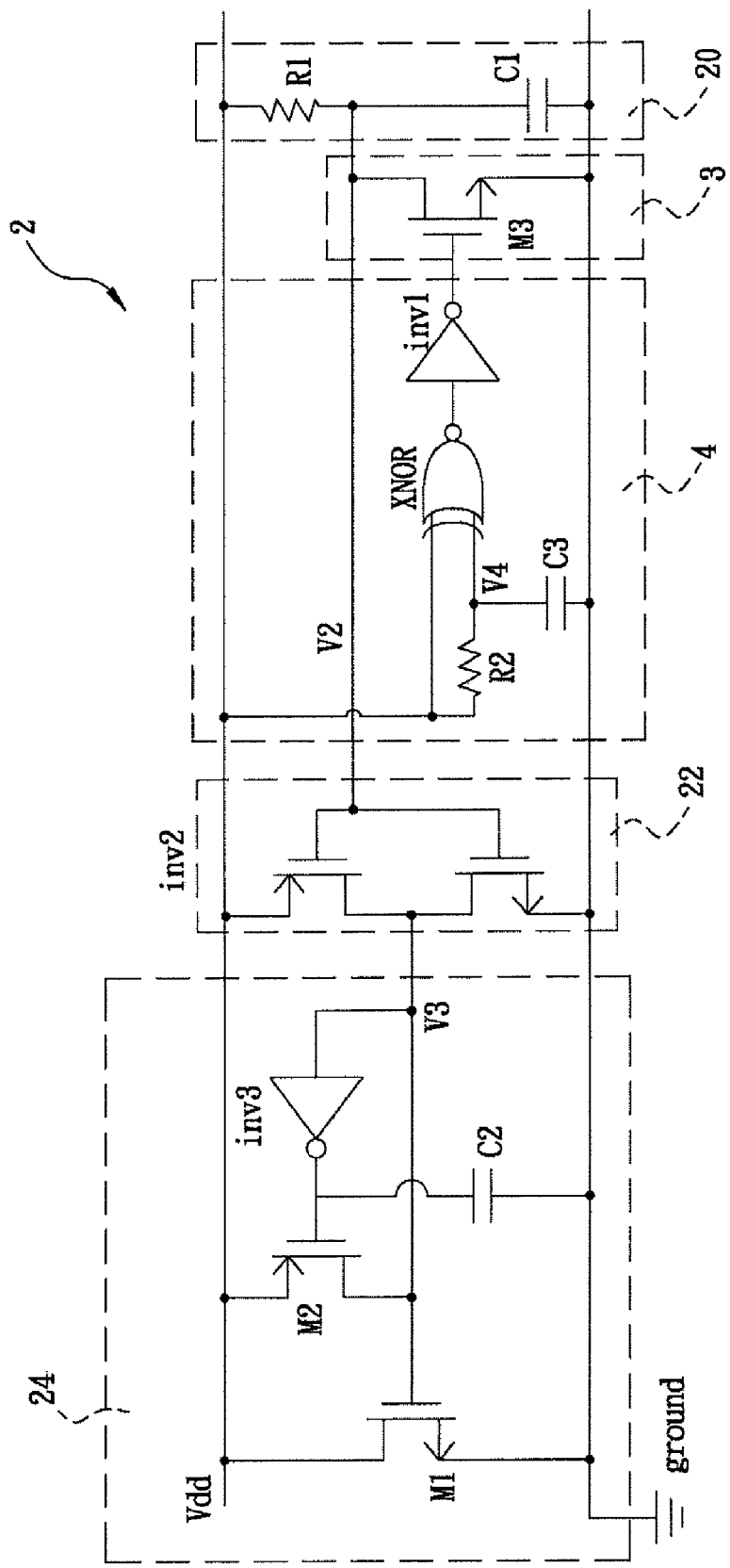
FIG. 9 shows a fifth embodiment of the ESD protection circuit according to the diagram in FIG. 7.

Refer to FIG. 9, a fifth embodiment of the ESD protection circuit according to the diagram in FIG. 7. The ESD detecting unit 20, ESD amplifying unit 22, ESD draining unit 24 and sustaining unit 3 and the structural connection of said fifth embodiment is the same as their corresponding counterparts in the fourth embodiment as depicted in FIG. 8. The sensing unit 4 consists of an XNOR gate, a first inverter INV1, a second resistor R2 and a third capacitor C3 wherein one end of the second resistor R2 and one end of the third capacitor C3 are coupled to a second input terminal of said XNOR gate, while the other end of said second resistor R2 and a first input terminal of said XNOR gate are coupled to said power source Vdd. The other end of said third capacitor C3 is coupled to said ground. An input terminal of said first inverter INV1 is coupled to an output terminal of said XNOR gate and an output terminal of said first inverter INV1 is coupled to a gate terminal of said third transistor M3.

When an IC incorporating said first embodiment is attacked by an ESD zap, the voltage level V2 at the input terminal of said ESD amplifying unit 22 instantaneously drops to the level of said ground and the voltage level V3 at the output terminal of said ESD amplifying unit 22 raises to the level of said power source Vdd. At this moment, the voltage level V4 at said second input terminal of said XNOR gate goes to ground and the output of sensing unit 4 becomes a logic one, which in turn activates said sustaining unit 3. The third transistor M3 is on, therefore the voltage level V2 at the input of said second inverter INV2 is maintained at said ground level. As two inputs of said sensing unit 4 are coupled together, the voltage level V4 at the second input terminal of said XNOR eventually becomes the same as said power source Vdd, thus switches the state at the output terminal of said sensing unit 4 and deactivates said sustaining unit 3. Afterwards, the voltage level V2 at the input terminal of said ESD amplifying unit 22 continues being gradually charged via said detecting unit 20. Ultimately V2 rises up to said power source Vdd level, switches the state of the ESD amplifying unit 22 and deactivates said draining unit 24. Said sensing unit 4 in this particular embodiment consists of a second resistor R2, a third capacitor C3, a first inverter INV1 and an XNOR gate. However, other circuits may achieve the same function without deviating from the scope of the present invention.

Figure 10:
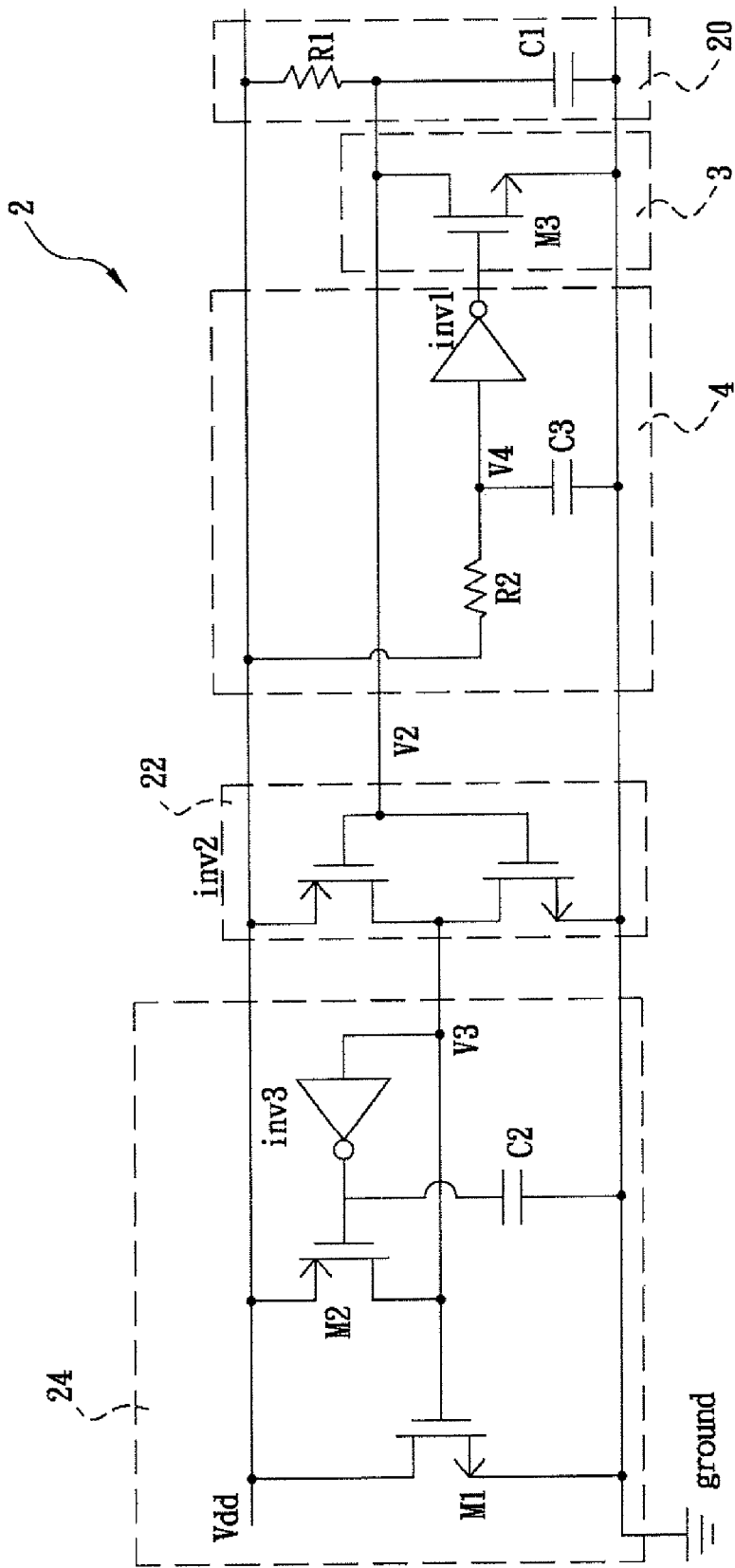
FIG. 10 shows a sixth embodiment of the ESD protection circuit according to the diagram in FIG. 7.

Refer to FIG. 10. FIG. 10 shows a sixth embodiment of the ESD protection circuit according to the diagram in FIG. 7. The ESD detecting unit 20, ESD amplifying unit 22, ESD draining unit 24 and sustaining unit 3 and the structural connection of said sixth embodiment is the same as their corresponding counterparts in the fourth embodiment as depicted in FIG. 8. However, said XNOR gate in said sensing unit 4 is now replaced by a first inverter INV1, said second resistor R2 and third capacitor C3 each has one end coupled to an input terminal of said first inverter INV1. The other end of said second resistor R2 is coupled to said power source Vdd and the other end of said third capacitor C3 is coupled to said ground.

When an IC incorporating said first embodiment is attacked by an ESD zap, the voltage level V2 at the input terminal of said ESD amplifying unit 22 instantaneously drops to the level of said ground and the voltage level V3 at the output terminal of said ESD amplifying unit 22 raises to the level of said power source Vdd. At this moment, the voltage level V4 at the input terminal of said first inverter INV1 goes to ground and the output of sensing unit 4 becomes a logic one, which in turn activates said sustaining unit 3. The third transistor M3 is on, therefore the voltage level V2 at the input of said second inverter INV2 is maintained at said ground level. As the input of said sensing unit 4 is coupled to said power source Vdd through said second resistor R2, with an adequately selected resistance, the voltage level V4 at the input terminal of said first inverter INV1 eventually becomes the same as said power source Vdd, thus switches the state at the output terminal of said sensing unit 4 and deactivates said sustaining unit 3. Afterwards, the voltage level V2 at the input terminal of said ESD amplifying unit 22 continues being gradually charged via said detecting unit 20. Ultimately V2 rises up to said power source Vdd level, switches the state of the ESD amplifying unit 22 and deactivates said draining unit 24. Said sensing unit 4 in this particular embodiment consists of a second resistor R2, a third capacitor C3, and a first inverter INV1. However, other circuits may achieve the same function without deviating from the scope of the current invention.

When an IC encounters a strong high-frequency power bounce, the ESD protection circuit depicted in FIG. 3 and FIG. 7 could be triggered and activate said sustaining unit 3. If in a relatively short duration of time (e.g. 0.1 ns), said power source Vdd spikes up a substantially high voltage (e.g. 2.5 volts) or said ground drops a substantially low voltage (e.g. −2.5V), the above-mentioned conventional ESD protection circuits enter latch-up and draw a huge leakage current. A circuit according to the present invention, however, will be able to self-recover through said sensing unit 4 and deactivate said sustaining unit 3 to avoid drawing a leakage current. Consequently, in a embodiment according to the present invention, no matter said ESD protection circuit is triggered by a sudden power on or a signal noise during normal operation, said sustaining unit will be deactivated by said sensing unit to prevent a latch-up from occurring and therefore is latch-up resistant.

While the invention herein disclosed has been described by means of specific embodiments, numerous modifications and variations could be made thereto by those skilled in the art without departing from the scope and spirit of the invention set forth in the claims.

What is claimed is:

1. A latch-up resistant electrostatic discharge (ESD) protection circuit, comprising:
   a clamping circuit, coupled to a power source and a ground, for discharging according to an ESD event when the clamping circuit is activated, comprising:
      a detecting unit for detecting the ESD event;
      an amplifying unit for being activated according to the detection result of said detecting unit; and
      a draining unit for draining an ESD current when said amplifying unit is activated;
   a sustaining unit, for directing electrostatic charge via said sustaining unit to said clamping circuit when the sustaining unit is activated; and
   a sensing unit for activating said sustaining unit, comprising:
      a logic unit for providing a logic value;
      a second resistor having one end coupled to said logic unit; and
      a second capacitor coupled between said ground and said logic unit.

2. The ESD protection circuit of claim 1, wherein said sensing unit automatically resets itself after said clamping circuit has discharged for a period of time to deactivate said sustaining unit.

3. The ESD protection circuit of claim 1, wherein the output of said sensing unit controls the activation and deactivation of said sustaining unit.

4. The ESD protection circuit of claim 1, wherein said sustaining unit and sensing unit are coupled between said detecting unit and said amplifying unit.

5. The ESD protection circuit of claim 1, wherein said amplifying unit is activated when said detecting unit detects the ESD event.

6. The ESD protection circuit of claim 1, wherein when said sustaining unit is activated, a closed current path between said sustaining unit and said amplifying unit is formed.

7. The ESD protection circuit of claim 1, wherein said amplifying unit controls the activation of said draining unit.

8. The ESD protection circuit of claim 1, wherein said detecting unit comprises a first capacitor and a first resistor, said first capacitor and said first resistor being coupled in series, said first capacitor being coupled to said power source, and said first resistor being coupled to said ground.

9. The ESD protection circuit of claim 1, wherein said sustaining unit comprises a second transistor, the source terminal of said second transistor being coupled to said ground, the drain terminal of said second transistor being coupled to said detecting unit, and the gate terminal of said second transistor being coupled to said sensing unit.

10. The ESD protection circuit of claim 1, wherein said amplifying unit comprises a second inverter.

11. The ESD protection circuit of claim 10, wherein said second inverter having a PMOS transistor and an NMOS transistor, the gate terminal of said PMOS transistor being coupled to the gate terminal of said NMOS transistor to form an input of said second inverter, and said input of said second inverter being coupled to said detecting unit.

12. The ESD protection circuit of claim 11, wherein the drain terminal of said PMOS transistor and the drain terminal of said NMOS transistor being coupled together to form an output of said second inverter.

13. The ESD protection circuit of claim 10, wherein said amplifying unit further comprises a first inverter.

14. The ESD protection circuit of claim 1, wherein said draining unit comprises a first transistor, the source terminal of said first transistor being coupled to said ground, the drain terminal of said first transistor being coupled to said power source, and the gate terminal of said first transistor being coupled to the amplifying unit.

15. The ESD protection circuit of claim 1, wherein said sustaining unit comprises a third transistor, the source terminal of said third transistor being coupled to said power source, the drain terminal of said third transistor being coupled to said detecting unit, and the gate terminal of said third transistor being coupled to said sensing unit.

16. The ESD protection circuit of claim 1, wherein said sensing unit comprises:
a third inverter having an output terminal coupled to said sustaining unit.

* * * * *